United States Patent [19]

Gomi et al.

[11] Patent Number: 4,608,142
[45] Date of Patent: Aug. 26, 1986

[54] METHOD OF MANUFACTURING MAGNETO-OPTIC RECORDING FILM

[75] Inventors: Manabu Gomi, Ichikawa; Masanori Abe, Otaku, both of Japan

[73] Assignee: Nippon Sheet Glass Co., Ltd., Osaka, Japan

[21] Appl. No.: 763,789

[22] PCT Filed: Nov. 15, 1984

[86] PCT No.: PCT/JP84/00547

§ 371 Date: Sep. 17, 1985

§ 102(e) Date: Sep. 17, 1985

[87] PCT Pub. No.: WO85/02292

PCT Pub. Date: May 23, 1985

[30] Foreign Application Priority Data

Nov. 17, 1983 [JP] Japan .............................. 58-216750
Jan. 17, 1984 [JP] Japan ................................ 59-6134
Mar. 23, 1984 [JP] Japan ............................... 59-55787

[51] Int. Cl.[4] ............................................. C23C 15/00
[52] U.S. Cl. ........................... 204/192 M; 204/192 R
[58] Field of Search ..................... 204/192 M, 192 R

[56] References Cited

U.S. PATENT DOCUMENTS

| | | | |
|---|---|---|---|
| 3,607,698 | 9/1971 | Kay et al. | 204/192 M |
| 3,676,867 | 7/1972 | Bacon et al. | 204/192 M |
| 4,414,087 | 11/1983 | Meckel | 204/192 M |
| 4,484,995 | 11/1984 | Pirich et al. | 204/192 M |
| 4,487,675 | 12/1984 | Meckel | 204/192 M |

FOREIGN PATENT DOCUMENTS

| | | | |
|---|---|---|---|
| 49-11784 | 2/1974 | Japan | 204/192 M |
| 59-185022 | 10/1984 | Japan | 204/192 M |
| 1184428 | 3/1970 | United Kingdom | 204/192 M |

OTHER PUBLICATIONS

Cuomo et al, Appl. Phys. Lett. 21 (1972), pp. 582–584.
Kadokura et al, IEEE Trans. Magn.; MAG 17, No. 6, Nov. 1981; pp. 3175–3177.

Primary Examiner—Arthur P. Demers
Attorney, Agent, or Firm—Woodcock Washburn Kurtz Mackiewicz & Norris

[57] ABSTRACT

In a method of manufacturing a magneto-optic recording film wherein a vertically magnetized film of a Bi-substituted rare-earth iron garnet is formed on a substrate, a target consisting of an oxide containing at least Bi atoms, Fe atoms and rare-earth element atoms is sputtered, and the atoms constituting the oxide which are released from the target by sputtering are deposited on the substrate which is held at a temperature of 700° C. or lower, thereby forming the vertically magnetized film consisting of the Bi-substituted rare-earth iron garnet.

With this method, a vertically magnetized film of a Bi-substituted rare-earth iron garnet having a large Bi substitution amount x, a very large Faraday rotation angle $\theta_F$, a sufficiently large coercive force $H_c$ and a sufficiently small absorption coefficient $\alpha$ can be manufactured, so that a magneto-optic recording film having excellent magneto-optic recording characteristics can be manufactured. In addition, since the material of the substrate on which a magneto-optic recording film is formed can be selected from various materials, the method is extremely advantageous from the manufacturing point of view.

15 Claims, 14 Drawing Figures

SAMPLE 5
FILM THICKNESS
1.5 μm

SAMPLE 5
FILM THICKNESS
1.2 μm

SAMPLE 5
FILM THICKNESS
0.9 μm

METHOD OF MANUFACTURING MAGNETO-OPTIC RECORDING FILM

TECHNICAL FIELD

The present invention relates to a method of manufacturing a magneto-optic recording film wherein a Bi-substituted rare-earth iron garnet film with an easy axis of magnetization normal to the film plane is formed on a substrate (hereafter, the vertically magnetized film denotes the film with an easy axis of magnetization normal to the film plane).

BACKGROUND ART

Iron garnet $R_{3-x}Bi_x(Fe, M)_5O_{12}$ obtained by substituting Bi for R in a rare-earth iron garnet $R_3(Fe, M)_5O_{12}$ is recently receiving much attention as a magneto-optic recording material. Note that in the above formulae, R is a rare-earth element, and M is an atom having a valence of 3 or a group of atoms having a valence equivalent to a valence of 3 such as $Al^{3+}$, $Ga^{3+}$, $Sc^{3+}$, $Tl^{3+}$, $(Co^{2+}+Ti^{4+})$ or the like. In the Bi-substituted rare-earth iron garnet, since some Rs are substituted with Bi, the Faraday rotation angle $\theta_F$ can be increased without much increasing the absorption coefficient $\alpha$ and, therefore, this material is generally an excellent magneto-optic recording material.

In order to improve performance of a magneto-optic material of the Bi-substituted rare-earth iron garnet having such a property, the Bi substitution amount x must be increased, which results in the increase of the Faraday rotation angle $\theta_F$. Conventionally, in a sintered ceramics of a rare-earth iron garnet, the Bi solid solution limit is known to be 50% of the dodecahedral site of the crystal structure. So monocrystalline films having a large Bi substitution amount x have been studied intensively.

A highly Bi-substituted rare-earth iron garnet thin film as described above is normally manufactured by the liquid phase epitaxy (LPE) method as described, e.g., in J.J. A. P., 19, 2105 (1980). However, a magnetic thin film manufactured by the liquid phase epitaxy method, wherein the film composition is $Bi_{0.6}Sm_{1.2}Er_{1.2}Ga_{1.0}Fe_{4.0}O_{12}$ has a small Faraday rotation angle $\theta_F$ of about 2.4 degree/$\mu$m at a light wavelength $\lambda = 500$ nm at which the Faraday rotation angle is expected to be maximum value. Such a small Faraday rotation angle is impractical.

Further, in LPE method, a Bi-substituted rare-earth iron garnet film must be formed on a single crystal substrate such as gadolinium gallium garnet $Gd_3Ga_5O_{12}$ (to be referred to as a GGG substrate hereafter) which is high in cost. However, a method capable of forming a highly Bi-substituted rare-earth iron garnet thin film on an amorphous substrate such as a glass substrate which has a high productivity has been desired. Although various studies have been made to provide such a method, a Bi-substituted rare-earth iron garnet thin film formed on an amorphous substrate obtained so far has been a polycrystalline film having a magnetization parallel to the film plane. A vertically magnetized film desired as a magneto-optic recording material has not yet been obtained.

DISCLOSURE OF INVENTION

An object of the present invention is to provide a method of manufacturing a magneto-optic recording film which is free from the above-mentioned drawbacks of the conventional methods.

In the conventional LPE method, a thin film must be grown at a high temperature of about 800° C. However, since the vapor pressure of Bi is extremely high, i.e., about 1 Torr, Bi is selectively vaporized from the melt during thin film formation by the LPE method. In view of this problem, the present invention is based on the concept that the LPE method is not suitable for forming a thin film of a Bi-substituted rare-earth iron garnet containing a high concentration of Bi. According to the estimation made by the present inventors, the Bi substitution amount x in a monocrystalline thin film which has been formed so far by conventional LPE methods using a GGG substrate is at best about 20% of the dodecahedral site of the rare-earth iron garnet.

In a method of manufacturing a magneto-optic recording film wherein a vertically magnetized film of a Bi-substituted rare-earth iron garnet is formed on a substrate, a method in the present invention is characterized in that a target consisting of an oxide containing at least Bi atoms, Fe atoms and rare-earth element atoms is sputtered, and the atoms constituting the oxide which are released from the target by sputtering are deposited on the substrate held at a temperature of 700° C. or lower, thereby forming the vertically magnetized film of the Bi-substituted rare-earth iron garnet. With this method, a vertically magnetized film of a Bi-substituted rare-earth iron garnet having a large Bi substitution amount x, a very large Faraday rotation angle $\theta_F$, a sufficiently large coercive force $H_c$ and a sufficiently small absorption coefficient $\alpha$ can be manufactured, so that a film having excellent magneto-optic recording characteristics can be manufactured. In addition, since the material of the substrate on which a magneto-optic recording film is formed can be selected from various materials, the method is extremely advantageous from the manufacturing point of view.

Examples of the target consisting of an oxide containing at least Bi atoms, Fe atoms and rare-earth element atoms include targets having a general formula $(Bi_2O_3)_x(R_2O_3)_y(Fe_2O_3)_z(M_2O_3)_u$ wherein $0 < x \leq 3/2$, $0 < y \leq 3/2$, $0 < z < 5/2$, and $0 \leq u \leq 5/2$, R is a rare-earth element such as Y or Sm, and M is $Al^{3+}$, $Ga^{3+}$, $Sc^{3+}$, $Tl^{3+}$, $(Co^{2+}+Ti^{4+})$ or the like.

Of such targets, a target wherein $0 < Y \leq 3/2$, $1 < (\frac{2}{3})x+y \leq 3/2$, $3/2 < z \leq 5/2$, and $z + u = 5/2$ is preferable.

Although a sintered ceramics which is easy to handle is preferable as the target, the target is not limited to a sintered ceramics. A mixture containing elements of the above formula can be used instead.

In order to form a thin film of a Bi-substituted rare-earth iron garnet having a single phase garnet structure by the above-mentioned sputtering method, the thin film composition must have a general formula $Bi_aR_b(Fe, M)_5O_{12}$ ($0 < a \leq 3$, $2 < a+b \leq 3$). If $a+b$ is 2 or less, too many defects are formed and a single phase garnet structure cannot be obtained. On the other hand a thin film formed by the sputtering method has a Bi content lower than that of the target due to scattering of Bi during sputtering. Under the sputtering conditions performed by the present inventors, the amount of Bi in the formed film is estimated to be about $\frac{2}{3}$ of that in the target.

Since a thin film containing a large amount of Bi can be formed by using a target containing a larger amount of Bi, in order to form a thin film containing a larger amount of Bi than a solid solution limit so far reported, a target containing a large amount of Bi, e.g., $Bi_aR_b(Fe, M)_5O_{12}(1.5 < a \leq 9/2, 2 < (\frac{2}{3})a+b \leq 3)$ is preferably used. When a target having the above composition is formed into a polycrystalline sintered ceramics, it will not consist of a single phase garnet structure but will be a mixture consisting of both the garnet phase and other impurity phases. However, such a target is preferably used since it has a high Bi content. In particular, the Bi substitution amount x is preferably 2 or more.

According to a method of manufacturing a magneto-optic recording film of the present invention, the target is sputtered and the atoms constituting the target are deposited on a substrate which is kept at a temperature of 700° C. or lower. When the substrate is kept at a temperature higher than 700° C., the vapor pressure of Bi is too high that a thin film having a large Bi substitution amount x as an objective of the present invention cannot be obtained.

Describing the method of manufacturing a magneto-optic recording film according to the present invention in more detail, the method is classified into the following two cases depending upon the material of a substrate used for forming a magneto-optic recording film and the properties of the thin film. In the first case, a (111) oriented GGG substrate is used as a substrate and a monocrystalline thin film of a Bi-substituted rare-earth iron garnet is formed on this substrate. In the second case, any substrate including an amorphous substrate such as glass or the like is used, and a vertically magnetized film of a Bi-substituted rare-earth iron garnet is formed on the substrate.

When a monocrystalline thin film is formed on a GGG substrate, the substrate must be kept at a temperature of 350° to 700° C. When the substrate temperature is lower than 350° C., the thin film formed will be amorphous and a monocrystalline thin film cannot be obtained. When a target represented by $Bi_aR_b(Fe, M)_5O_{12}$ $(0 < a \leq 9/2, 2 < (\frac{2}{3})a+b \leq 3)$ or the like is sputtered, a monocrystalline thin film of a Bi-substituted rare-earth iron garnet can be formed. In order to obtain better magnetic characteristics of the monocrystalline thin film, a heat-treatment such as re-heating or gradual cooling can be performed.

When any substrate including an amorphous substrate such as glass or metal, semiconductor, insulator is used, the vertically magnetized film of the polycrystalline Bi-substituted rare-earth iron garnet is obtained through crystallization by annealing of the amorphous film deposited on the substrate kept at 500° C. or lower. Herein, the amorphous film must have a composition corresponding to that of a Bi-substituted rare-earth iron garnet.

When sputtering on any substrate other than the above monocrystalline substrate (e.g., glass substrate) is performed at a substrate temperature higher than 500° C., an amorphous thin film cannot be obtained, and a crystalline magnetic thin film having a roughened surface is directly formed. However, when an amorphous thin film is formed and is then annealed to crystallize the film, a polycrystalline vertically magnetized film of a Bi-substituted rare-earth iron garnet film with magnetic anisotropy perpendicular to the film plane which has less surface roughness can be formed.

Describing in more detail, the method of manufacturing a polycrystalline vertically magnetized film of a Bi-substituted rare-earth iron garnet film with magnetic anisotropy perpendicular to the film plane includes the following two cases; the case of forming a protective film after forming the amorphous thin film and the case of not forming such a protective film.

When annealing is performed without forming a protective film on the amorphous thin film, the substrate temperature during formation of the amorphous thin film is preferably kept at 300° to 500° C. and more preferably at 400° to 450° C. An amorphous thin film formed at a substrate temperature lower than 300° C. tends to result in a magnetic thin film which develops surface roughness upon annealing and is not preferable.

When a protective film is formed on the amorphous thin film as described above, surface roughness upon crystallization by annealing and vaporization of Bi are prevented, and a vertically magnetized film having a smoother surface can be formed.

The substrate temperature must be 500° C. or lower for the reasons described above. The protective film can be selected from various films which do not react with a formed thin film at an annealing temperature of, e.g., about 700° C. Examples of such films may include oxide films such as $SiO_2$, $ZnO$, $TiO_2$ or $CeO_2$, nitride films such as $Si_3N_4$, and fluoride films such as $BaF_2$ or $CaF_2$. The thickness of the protective film must be 500 Å or more.

Annealing for crystallizing the amorphous thin film is preferably performed at a temperature of 500° to 900° C. When the annealing temperature is lower than 500° C., crystallization cannot be easily started, which is not desirable. However, when the annealing temperature is higher than 900° C., vaporization of Bi may occur and a reaction between the substrate and the thin film may occur, which is not desirable.

BEST MODE OF CARRYING OUT THE INVENTION

A method of manufacturing a magneto-optic recording film according to the present invention will be described with reference to embodiments applied to the manufacture of a thin film of a Bi-substituted rare-earth iron garnet represented by $(Y, Bi)_3(Fe, Al)_5O_{12}$, referring to the accompanying drawings. $(Y, Bi)_3(Fe, Al)_5O_{12}$ is obtained by partially substituting Y in a yttrium iron garnet $Y_3Fe_5O_{12}$ (YIG) with Bi and partially substituting Fe thereof with Al. When Y is partially substituted with Bi, the Faraday rotation angle $\theta_F$ can be increased without much increasing the absorption coefficient $\alpha$. When Fe is partially substituted with Al, the absorption coefficient $\alpha$ and Curie temperature can be decreased, and the saturation magnetization can be reduced to allow easy manufacture of a vertically magnetized film.

The first embodiment of the present invention will now be described with reference to FIG. 1.

Figure 1:
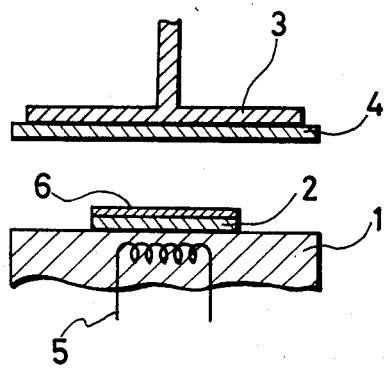
FIG. 1 is a sectional view showing a first embodiment of the present invention together with an RF sputtering apparatus used in this embodiment.

Referring to FIG. 1, a (111) oriented monocrystalline GGG substrate 2 is placed on a stainless steel electrode plate 1 also serving as a sample table of an RF sputtering apparatus. A target 4 is mounted on an electrode plate 3. The target 4 is a sintered ceramics disk of a polycrystalline iron garnet (a composition: $Bi_{2.0}Y_{1.0}Fe_{3.8}Al_{1.2}O_{12}$) with other impurity phases. Since a heater 5 is mounted on the electrode plate 1, the GGG substrate 2 is heated to a predetermined temperature by the heater 5 through the electrode plate 1.

After the interior of the sputtering apparatus is evacuated to a predetermined degree of vacuum, a mixture gas of Ar and $O_2$ ($Ar:O_2=9:1$) is supplied into the sputtering apparatus to a pressure of about 7 Pa. When the degree of vacuum is stabilized, a predetermined RF voltage is applied between the electrode plates 1 and 3 so as to start glow discharge. $Ar^+$ ions generated by discharge sputter the surface of the target 4, and this sputtering releases atoms such as Bi, Y, Fe, Al and O from the target 4. The released atoms are deposited on the GGG substrate 2 which is heated to the predetermined temperature, and a monocrystalline thin film 6 of $(Y, Bi)_3(Fe, Al)_5O_{12}$ is epitaxially grown on the GGG substrate 2. When the sputtering power was 110 W and the sputtering time was 5 hours, the obtained thin film 6 had a thickness of 1.5 $\mu$m.

The thin film 6 is annealed together with the GGG substrate 2 having the film 6 thereon under predetermined conditions so as to remove strain in the thin film 6. X-ray diffractometry of the thin film 6 thus obtained revealed that the film 6 was monocrystalline.

When the monocrystalline thin film 6 manufactured in the first embodiment was observed through an optical microscope, it had an arabesque magnetic domain structure and was proved to be an excellent magnetic thin film having superior characteristics as shown in FIGS. 2 to 11. The measurement results will sequentially be described hereinbelow. When the Faraday rotation angle $\theta_F$ shown in FIGS. 2 and 7 to 11 was measured, a He-Ne laser (wavelength: 6328 Å) was used as a light source. Measurement was performed by transmitting light through the thin film 6. Measurement of the Curie point shown in FIG. 7 was performed for a sample having a three-layered structure consisting of a GGG substrate 2 having an Al film as a reflecting film on a thin film 6.

Figure 2:
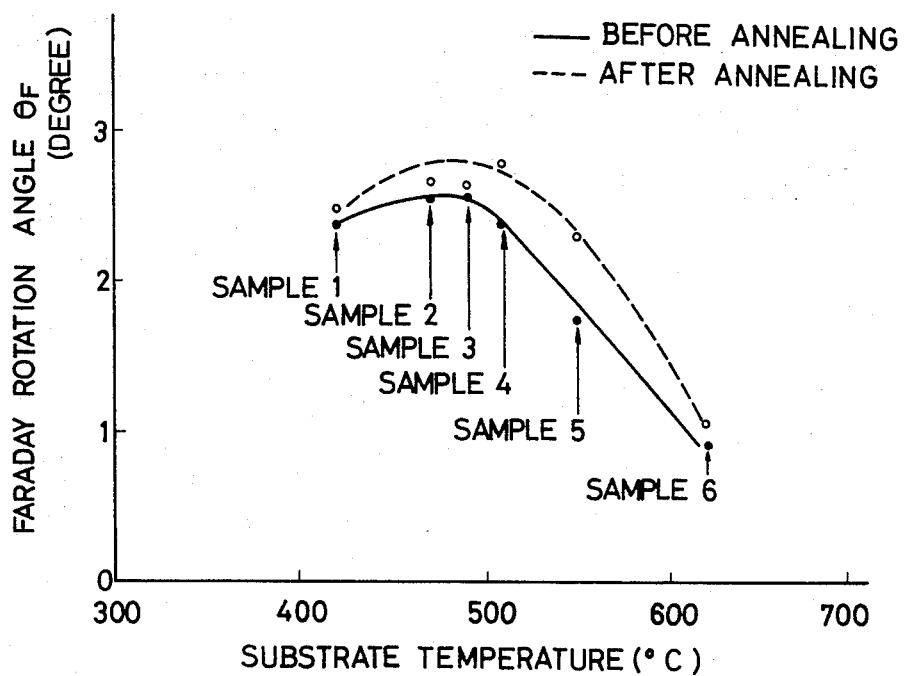
FIGS. 2 and 3 are graphs showing the substrate temperature dependence of the Faraday rotation angle $\theta_F$ and the coercive force $H_c$, respectively, of $(Y, Bi)_3(Fe, Al)_5O_{12}$ monocrystalline thin film manufactured by the first embodiment of the present invention.
Figure 3:
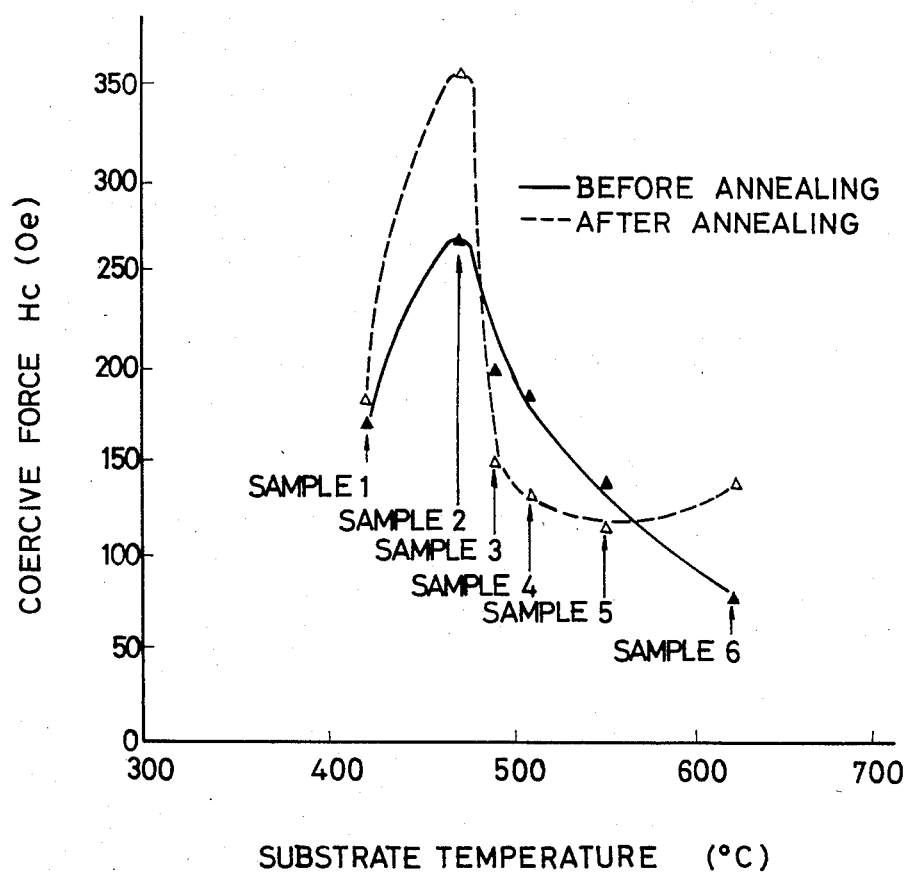

FIGS. 2 and 3 are graphs showing the Faraday rotation angle $\theta_F$ and the coercive force $H_c$ of thin films 6 (respective samples are represented by reference numerals 1 to 6, respectively) manufactured at respective substrate temperatures of 420° C., 470° C., 490° C., 510° C., 550° C. and 620° C. As shown in FIG. 2, the thin films 6 manufactured on the GGG substrate 2 at 420° to 620° C. had Faraday rotation angles $\theta_F$ of 1 to 2.75 degree after annealing. Annealing was performed in air at 640° C. for 5 hours for samples 1 and 2 and at 740° C. for 5 hours for samples 3 to 6. The Faraday rotation angles $\theta_F$ of the thin films 6 manufactured in this embodiment are considerably larger than that of a Bi-substituted rare-earth iron garnet thin film manufactured by the above-mentioned LPE method, i.e., about 0.5 degree.

Measurement of the crystal lattice constant of the thin films 6 by X-rays revealed that the thin films 6 of the embodiment had a Bi content up to a solid solution limit (50% of the dodecahedral site). Therefore, it was found that a large Faraday rotation angle $\theta_F$ was obtained by substitution with a large amount of Bi.

The thin films 6 according to the embodiment of the present invention had coercive forces $H_c$ as high as 140 to 350 Oe, as shown in FIG. 3.

FIGS. 2 and 3 show the Faraday rotation angle $\theta_F$ and the coercive force $H_c$ of each as-sputtered film 6 together with the data of the Faraday rotation angle $\theta_F$ and the coercive force $H_c$ of the film 6 after annealing. Among the samples shown in FIGS. 2 and 3, sample 6 (substrate temperature: 620° C.) had a film thickness of 2.0 $\mu$m (sputtering time: 7 hours), and remaining five samples (substrate temperatures: 420° to 550° C.) had a thickness of 1.5 $\mu$m.

Figure 4:
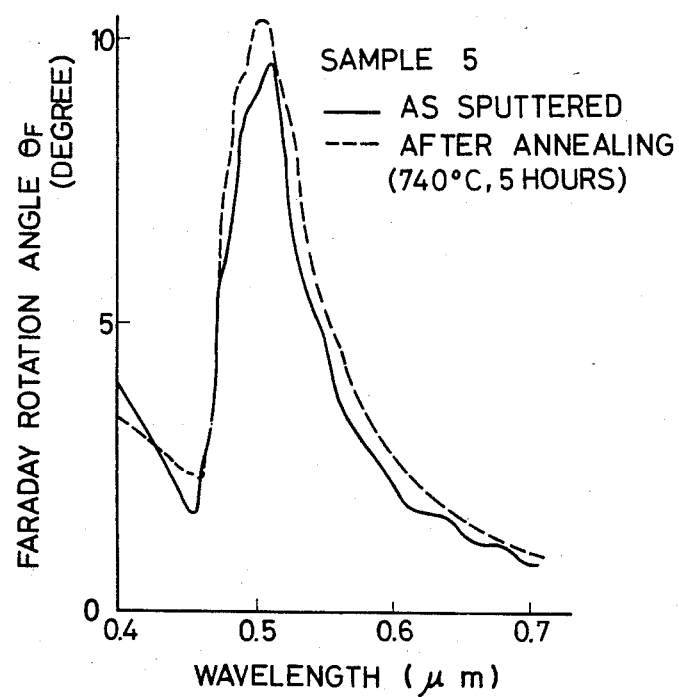
FIGS. 4 and 5 are graphs showing the light wavelength dependence of the Faraday rotation angle $\theta_F$ for samples 5 and 3 shown in FIGS. 2 and 3, respectively.
Figure 5:
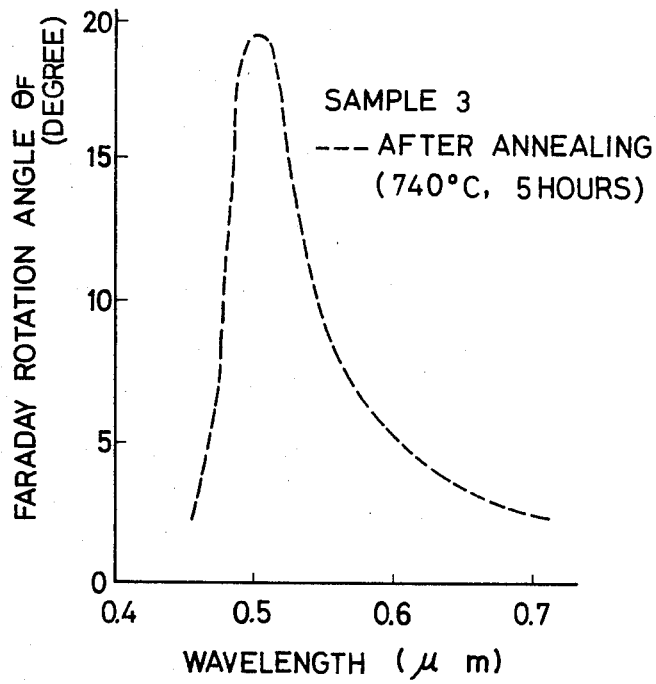

FIG. 4 shows the light wavelength dependece of the Faraday rotation angle $\theta_F$ of sample 5 (substrate temperature: 550° C.), and FIG. 5 shows the light wavelength dependence of the Faraday rotation angle $\theta_F$ of sample 3 (substrate temperature: 490° C.). As can be seen from these graphs, the Faraday rotation angle $\theta_F$ in the range of $\lambda=0.4$ to 0.7 $\mu$m is 1 to 10 degree for sample 5 and 1 to 20 degree for sample 3 after annealing; these values are very large. For both the samples, it can be seen that the Faraday rotation angle $\theta_F$ is very large near a wavelength of 0.5 $\mu$m. FIG. 4 also shows the measurement result of the as-sputtered film 6 for comparison.

Figure 6:
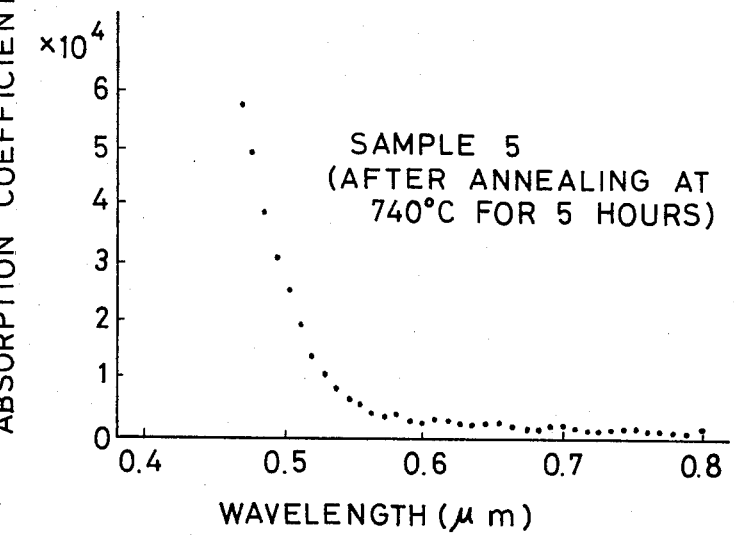
FIG. 6 is a graph showing the light wavelength dependence of an absorption coefficient $\alpha$ for sample 5 shown in FIGS. 2 and 3.

FIG. 6 shows the wavelength dependence of the absorption coefficient $\alpha$ of the thin film 6 (sample 5). It can be seen from FIG. 6 that the absorption coefficient $\alpha$ of sample 5 is sufficiently small for visible light having a wavelength of 0.55 $\mu$m or more; the thin film 6 is substantially transparent to light in this wavelength range and has an absorption edge near 0.5 $\mu$m.

Figure 7:
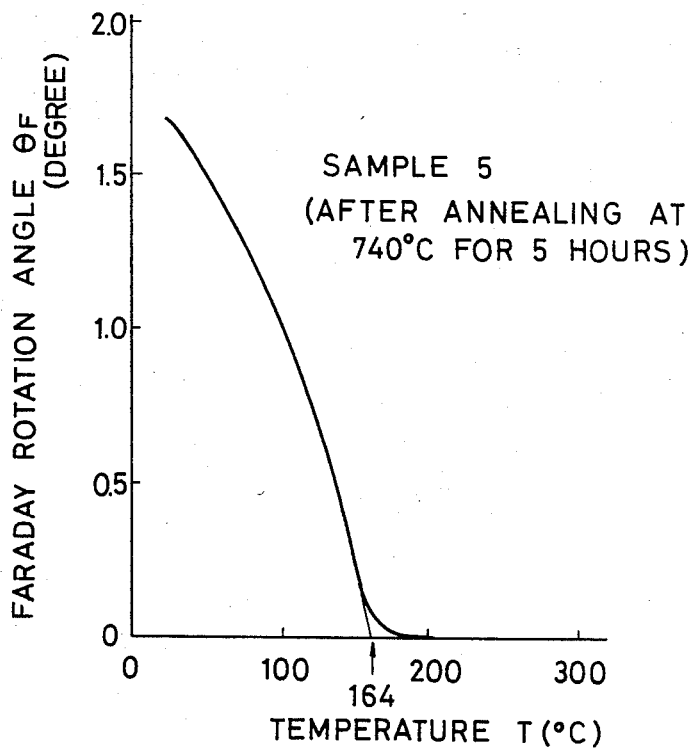
FIG. 7 is a graph showing the temperature dependence of the Faraday rotation angle $\theta_F$ for sample 5 shown in FIGS. 2 and 3.

FIG. 7 shows temperature dependence of the Faraday rotation angle $\theta_F$ for sample 5. It is seen from FIG. 7 that the Faraday rotation angle $\theta_F$ of sample 5 monotonously decreases with an increase in temperature T from room temperature to about 170° C. FIG. 7 also indicates that the Curie temperature $T_c$ is 164° C. The slow change in the Faraday rotation angle $\theta_F$ at temperature T=160° to 200° C. may be attributed to the residual strain and random arrangement of Fe and Al atoms in the thin film 6.

Figure 8:
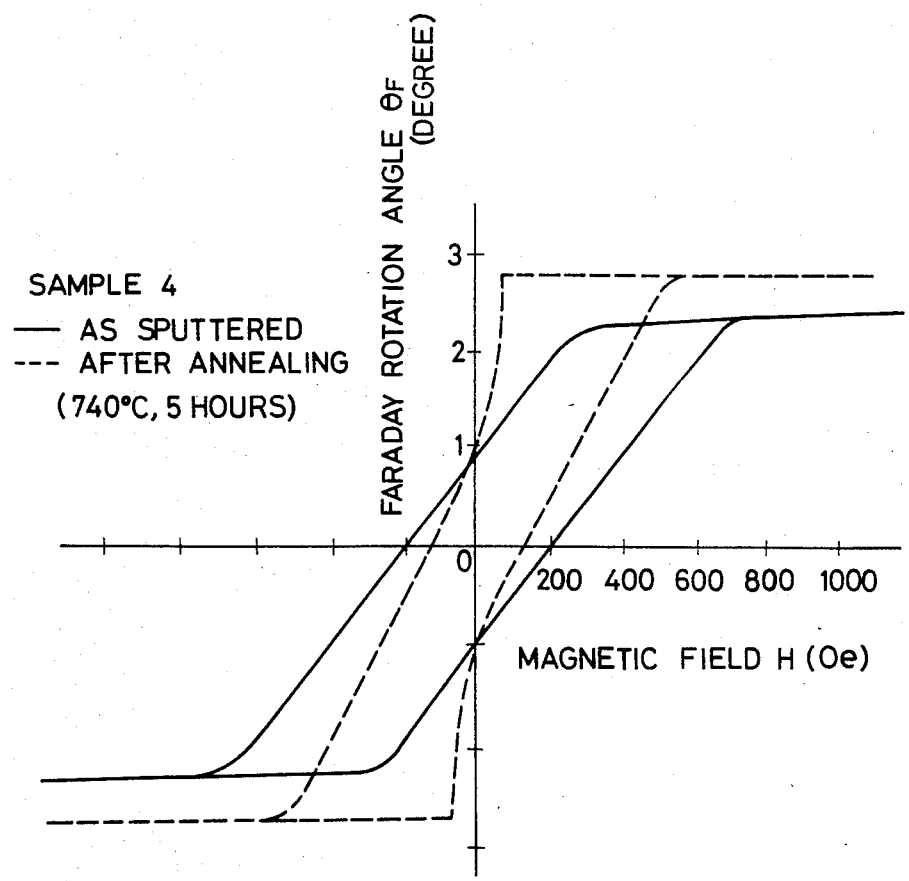
FIG. 8 is a graph showing the hysteresis characteristics for sample 4 shown in FIGS. 2 and 3.

FIG. 8 shows the hysteresis characteristics of the Faraday rotation angle $\theta_F$ of sample 4 (substrate temperature: 510° C.) as a function of a magnetic field H applied along a direction perpendicular to the film plane. As can be seen from this figure, the hysteresis characteristics change before and after annealing and the Faraday rotation angle $\theta_F$ increases after annealing.

Figure 9:
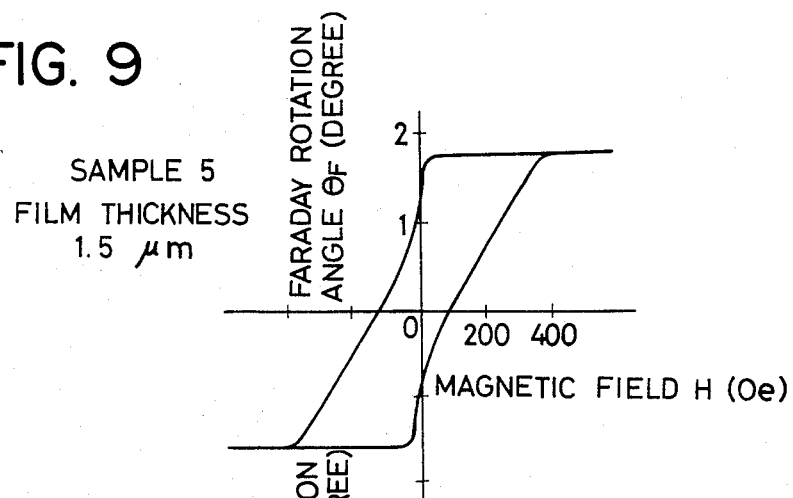
FIGS. 9 to 11 are graphs showing the hysteresis characteristics for sample 5 shown in FIGS. 2 and 3 for three different thicknesses thereof.
Figure 10:
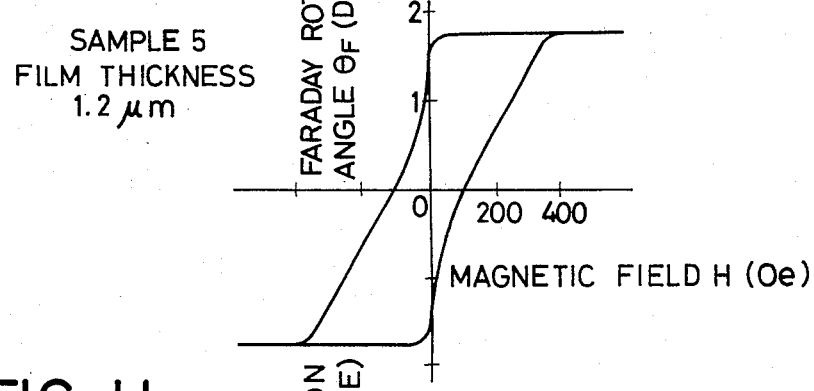
Figure 11:
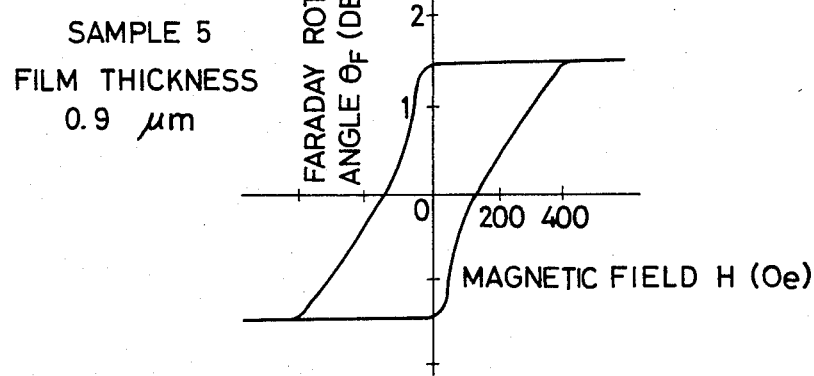

FIGS. 9 to 11 show the hysteresis characteristics of the thin film 6 of sample 5 after annealing, for three different film thicknesses, at the central portion (film thickness: 1.5 μm) and this peripheral portions (film thicknesses: 1.2 μm and 0.9 μm), i.e., 1.5, 1.2 and 0.9 μm. It can be seen from these figures that the smaller the film thickness, the better the squareness of the loop, and especially when the film thickness is 1 μm or less, the film exhibits particularly preferable hysteresis characteristics for magneto-optic recording applications.

As can be seen from the above results, the $(F, Bi)_3(Fe, Al)_5O_{12}$ monocrystalline thin film 6 manufactured in the first embodiment has a very large Faraday rotation angle $\theta_F$, a sufficiently large coercive force $H_c$ and a very small absorption coefficient $\alpha$, thereby providing highly desirable properties as a magneto-optic recording material.

The second embodiment of the present invention will now be described with reference to FIG. 12.

Figure 12:
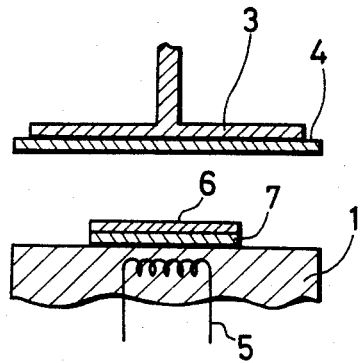
FIG. 12 is a sectional view showing a second embodiment according to the present invention together with an RF sputtering apparatus used in this embodiment.

First, as shown in FIG. 12, an amorphous quartz glass is used as the substrate 7, and is heated to 440° C. A target 4 similar to that of the first embodiment is used, and the target 4 is sputtered under similar conditions to those in the first embodiment, thereby forming $(Y, Bi)_3(Fe, Al)_5O_{12}$ thin film 6 on the quartz glass substrate 7. When the sputtering power was 110 W and the sputtering time was 2 hours and a half, the obtained thin film 6 had a thickness of 0.8 μm.

The thin film 6 obtained in this manner was annealed in air at 700° C. for 3 hours so as to crystallize the thin film 6.

When crystal structure of the thin film 6 manufactured in the second embodiment was examined by X-ray diffractometry, the film was proved to be a polycrystalline film having no preferred orientation. An optical microscope measurement showed that although the film is polycrystalline, it has an arabesque bubble-like magnetic domain structure and was an excellent vertically magnetized film having the following superior characteristics.

Figure 13:
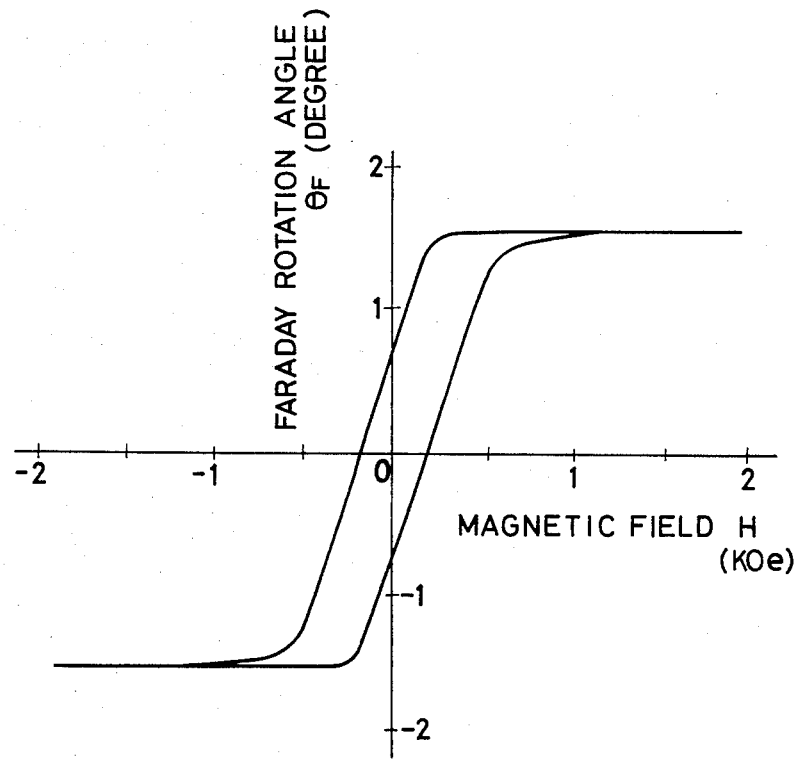
FIG. 13 is a graph showing the hysteresis characteristics of a $(Y, Bi)_3(Fe, Al)_5O_{12}$ thin film manufactured by the second embodiment of the present invention.

More specifically, as shown in FIG. 13, the hysteresis of the Faraday rotation angle $\theta_F$ of the thin film 6 as a function of a magnetic field H applied along a direction perpendicular to the film plane exhibited an excellent squareness. The magnetic torque measurement revealed that the film is a vertically magnetized film. The film had a large Faraday rotation angle $\theta_F$ of about 1.5 degree and a sufficiently large coercive force $H_c$ of about 200 Oe. Thus, the thin film 6 has very desirable properties as a magneto-optic recording material. These may indicate that the film 6 contains the large amount of Bi up to its solid solution limit, applying a large perpendicular magnetic anisotropy. In FIG. 13, a light source for measuring the Faraday rotation angle $\theta_F$ was a He-Ne laser (wavelength: 6328 Å). The measurement was performed by transmitting light through the thin film 6.

The thin film 6 formed in this manner has relatively small surface roughness adequate to the magneto-optic recording applications.

In this manner, according to the second embodiment, a highly Bi-substituted rare-earth iron garnet thin film which has excellent vertical magnetization characteristics although it is polycrystalline can be formed on a quartz glass substrate having a good productivity.

The magnetic thin film manufactured in the second embodiment allows direct formation of a reflecting layer thereon, and therefore can be magneto-optic recording medium able to thermomagnetically write using a light with a relatively low power.

The third embodiment of the present invention will now be described with reference to FIGS. 12 and 14.

By a sputtering method similar to that in the second embodiment, an amorphous thin film 6 of $(Y, Bi)_3(Fe, Al)_5P_{12}$ having a film thickness of 0.8 μm is formed on a quartz glass substrate 7 heated to 440° C., as shown in FIG. 12.

Figure 14:
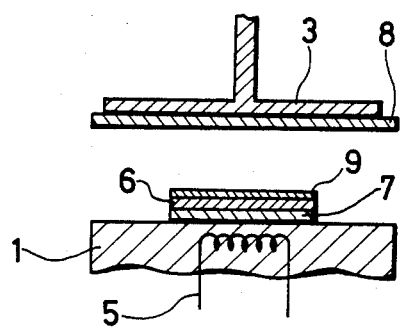
FIG. 14 is a sectional view showing a third embodiment of the present invention together with an RF sputtering apparatus used in this embodiment.

Then, as shown in FIG. 14, after replacing a target 4 mounted on an electrode plate 1 with a target 8 of $SiO_2$, similar sputtering is performed using the target 8, thereby forming an $SiO_2$ layer 9 on the thin film 6. During this film formation, the quartz glass substrate 7 is held at room temperature. When the sputtering power was 200 W and the sputting time was 30 minutes, the obtained $SiO_2$ layer 9 had a thickness of 0.5 μm.

A sample having a three-layered structure consisting of the quartz glass substrate 7, the thin film 6 and the $SiO_2$ layer 9 was annealed in air at 700° C. for 3 hours.

When X-ray diffractometry was performed, the thin film 6 manufactured in this manner had no preferred orientation as in the case of the thin film 6 manufactured in the second embodiment. When the film 6 was observed through an optical microscope, although it was polycrystalline it was found to have an arabesque bubble-like magnetic domain structure and to be an excellent vertically magnetized film having excellent characteristics equivalent to those shown in FIG. 13. In this embodiment, due to the presence of the protective film constituted by the $SiO_2$ layer 9, out-diffusion of atoms such as Bi contained in the thin film 6 and surface roughening during annealing can be prevented, and growth of crystal grains of the thin film 6 can be suppressed.

In this manner, according to the third embodiment of the present invention, as in the case of the second embodiment, a polycrystalline vertically magnetized film having excellent characteristics can be formed on a quartz glass substrate 7 having an excellent productivity. In addition, due to the presence of an $SiO_2$ layer 9 as a protective film, surface roughness of the thin film 6 resulting from annealing to crystallize the film can be more effectively prevented than in the second embodiment. Since out-diffusion of Bi from the thin film 6 during annealing can be prevented by the $SiO_2$ layer 9, the annealing temperature can be set to be higher than that in the second embodiment.

We claim:

1. A method of manufacturing a magneto-optic recording film wherein a vertically magnetized film of a Bi-substituted rare-earth iron garnet is formed on a substrate, characterized in that a target consisting of an oxide containing at least Bi atoms, Fe atoms and rare-earth element atoms is sputtered, and the atoms constituting the oxide which are released from the target by sputtering are deposited on the substrate which is held at a temperature of 700° C. or lower, thereby forming the vertically magnetized film consisting of the Bi-substituted rare-earth iron garnet.

2. A method according to claim 1, wherein the target has a formula $(Bi_2O_3)_x(R_2O_3)_y(Fe_2O_3)_z(M_2O_3)_u$ {wherein R is a rare-earth element, M is an atom having a valence of 3 or a group of atoms having a valence equivalent to a valence of 3, and $0 < x \leq 3/2$, $0 < y \leq 3/2$, $0 < z < 5/2$, and $0 \leq u \leq 5/2$}.

3. A method according to claim 1, wherein the target has a formula $(Bi_2O_3)_x(R_2O_3)_y(Fe_2O_3)_z(M_2O_3)_u$ {wherein R is a rare-earth element, M is an atom having a valence of 3 or a group of atoms having a valence equivalent to a valence of 3, and $0 < y \leq 3/2$, $1 < (\frac{2}{3})x + y \leq 3/2$, $3/2 < z \leq 5/2$, and $z + u = 5/2$}.

4. A method according to claim 1, wherein the target is a sintered ceramics consisting of coexisting multiple phases having a formula $Bi_aR_b(Fe, M)_5O_{12}$ {wherein R is a rare-earth element, M is an atom having a valence of 3 or a group of atoms having a valence equivalent to a valence of 3, and $1.5 < a \leq 9/2$ and $2 < (\frac{2}{3})a + b \leq 3$}.

5. A method according to any one of claims 2 to 4, wherein the atom having a valence of 3 or the group of atoms having a valence equivalent to a valence of 3 represented by M is selected from the group consisting of $Al^{3+}$, $Ga^{3+}$, $Sc^{3+}$, $Tl^{3+}$, and $(Co^{2+} + Ti^{4+})$.

6. A method according to any one of claims 1 to 5, wherein the substrate is a (111) oriented monocrystalline gadolinium galium garnet substrate.

7. A method according to claim 6, wherein the substrate temperature is 350° to 700° C.

8. A method according to claim 1, wherein an amorphous thin film which can be converted into a Bi-substituted rare-earth iron garnet by iron garnet by crystallization is formed by sputtering, and the amorphous thin film is crystallized by annealing.

9. A method according to claim 8, wherein the substrate is a glass substrate.

10. A method according to claim 8, wherein the substrate temperature is 300° to 500° C.

11. A method according to claim 8, wherein the substrate temperature is 400° to 450° C.

12. A method according to claim 8, wherein the annealing temperature is 500° to 900° C.

13. A method according to claim 8, wherein an amorphous thin film which can be converted into a Bi-substituted rare-earth iron garnet by crystallization is formed on the substrate by sputtering, a protective film for preventing vaporization of Bi is formed on the amorphous thin film, and annealing is performed so as to crystallize the amorphous Bi-substitued rare-earth iron garnet.

14. A method according to claim 13, wherein the protective film is one member selected from the group consisting of an $SiO_2$ film, a ZnO film, a $TiO_2$ film, a $CeO_2$ film, a $Si_3N_4$ film, a $BaF_2$ film and a $CaF_2$ film.

15. A method according to claim 13, wherein the protective film has a thickness of 500 Å or more.

* * * * *